United States Patent
Kobayashi

(10) Patent No.: US 7,045,471 B2
(45) Date of Patent: May 16, 2006

(54) METHOD FOR FORMING RESIST PATTERN IN REVERSE-TAPERED SHAPE

(75) Inventor: Satoshi Kobayashi, Shizuoka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 64 days.

(21) Appl. No.: 10/220,394

(22) PCT Filed: Mar. 6, 2001

(86) PCT No.: PCT/JP01/01708

§ 371 (c)(1),
(2), (4) Date: Aug. 29, 2002

(87) PCT Pub. No.: WO01/67180

PCT Pub. Date: Sep. 13, 2001

(65) Prior Publication Data

US 2003/0022109 A1    Jan. 30, 2003

(30) Foreign Application Priority Data

Mar. 9, 2000    (JP) .............................. 2000-064809

(51) Int. Cl.
*H01L 21/31* (2006.01)
*G03C 1/492* (2006.01)
(52) U.S. Cl. .................................. 438/780; 430/270.1
(58) Field of Classification Search ................ 438/793, 438/794, 942, 948, 618, 725, 758, 780, 781, 438/789, 790, 949; 430/270.1
See application file for complete search history.

(56) References Cited

U.S. PATENT DOCUMENTS

| | | | |
|---|---|---|---|
| 4,571,375 A | 2/1986 | Benedikt | 430/197 |
| 5,609,988 A * | 3/1997 | Miyamoto et al. | 430/270.1 |
| 5,738,931 A * | 4/1998 | Sato et al. | 428/209 |
| 6,110,641 A | 8/2000 | Trefonas, III et al. | 430/325 |
| 6,137,220 A | 10/2000 | Nagayama et al. | 313/504 |
| 6,306,559 B1 * | 10/2001 | Tanamura et al. | 430/315 |
| 6,744,063 B1 * | 6/2004 | Yoshikawa et al. | 257/10 |

FOREIGN PATENT DOCUMENTS

| | | |
|---|---|---|
| EP | 1 046 955 | 10/2000 |
| JP | 0 621 509 A1 | 4/1994 |
| JP | 10321622 A * | 12/1998 |

OTHER PUBLICATIONS

English Abstract for JP 10-213902, Aug. 11, 1998.
English abstract for JP 61-023618, Feb. 1, 1986.
English abstract for JP 05-165218, Jul. 2, 1993.
English abstract for JP 05-178951, Jul. 20, 1993.
English abstract for JP 07-092668, Apr. 7, 1995.

* cited by examiner

*Primary Examiner*—Brook Kebede
(74) *Attorney, Agent, or Firm*—Alan P. Kass

(57) ABSTRACT

A negative-working radiation sensitive resin composition with good heat resistance and low water absorption, which is useful for formation of a resist pattern in the lift-off method or as an insulating member in a organic EL panel and is able to form a reverse tapered resist pattern with a good shape. The negative-working radiation sensitive resin composition comprises (A) an alkali-soluble resin obtained by polycondensation of methylol bisphenol compounds represented by general formula (I) below, phenol compounds used as necessary and aldehydes, (B) a crosslinking agent and (C) a photo-acid generator. The negative-working radiation sensitive resin composition is applied onto a substrate, exposed to light and developed to form a reverse tapered pattern. A metal pattern is formed by vapor-depositing a metal film over the reverse tapered pattern and then removing the resist pattern by developer.

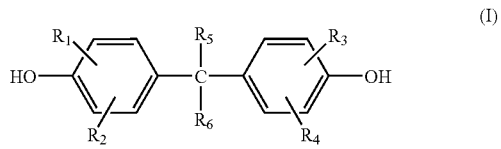

(I)

Wherein $R_1$ to $R_4$ each represent a hydrogen atom, a $C_1$ to $C_3$ alkyl group or —$CH_2OH$ whereupon at least one of $R_1$ to $R_4$ represents —$CH_2OH$, and $R_5$ and $R_6$ each represent a hydrogen atom or a $C_1$ to $C_3$ alkyl group.

4 Claims, 2 Drawing Sheets

METHOD FOR FORMING RESIST PATTERN IN REVERSE-TAPERED SHAPE

TECHNICAL FIELD

This invention relates to a method of forming a reverse tapered resist pattern by use of a novel negative-working radiation sensitive resin composition, a method of forming a metal film pattern by use of the reverse tapered resist pattern formed by the above-described method, and use of the novel negative-working radiation sensitive resin composition as an insulating member between metal films. More particularly, this invention relates to a method of forming a reverse tapered resist pattern by use of a novel negative-working radiation sensitive resin composition which can be utilized preferably as a material for forming a metal film pattern or as material for an insulating member between metal films in production of semiconductor integrated circuits, photo-masks, liquid crystal displays (LCDs) and organic electroluminescent displays (organic EL displays) etc., as well as to a method of forming a metal film pattern by use of the reverse tapered resist pattern in a lift-off method and to use of the resist pattern as a material for an insulating member between metal films in organic EL displays.

BACKGROUND ART

As the method of patterning a metal film such as thin-film electrodes etc., there are two general methods, that is, (a) a method in which a photoresist film is formed by applying a radiation sensitive resin composition onto a metal film, subjected to pattern exposure and then developed to form a resist pattern, followed by wet or dry etching, and (b) a lift-off method in which a photoresist film on a substrate is subjected to pattern exposure and developed, and then the substrate having the resist pattern thus formed is vapor-deposited with a metal, followed by releasing and removing the resist pattern. In this lift-off method, vapor-deposition of a metal onto the substrate having the resist pattern thereon brings about formation of vapor-deposited films on the resist pattern and the bare substrate, and it is well-known that if a profile of the resist pattern has an overhung or reverse-tapered shape, the vapor-deposited film formed on the substrate becomes discontinuous with the vapor-deposited film formed on the resist pattern, thus being preferable in forming electrodes.

A wide variety of positive-or negative-working radiation sensitive resin compositions have been used for forming photoresist films in production of semiconductor integrated circuits such as ultra-LSI etc. or production of liquid crystal display panels for LCD. However, the number of radiation sensitive resin compositions known to be preferable for the lift-off method described above is limited. A reverse tapered resist pattern, therefore, has been formed by selecting suitable radiation sensitive resin composition from known compositions and setting special processing conditions, for example, regulating exposure conditions or development conditions. Further, even if a reverse tapered resist pattern is successfully obtained, the resist pattern usually has a problem of pattern profile or is problematic due to inferiority in characteristics of the resist film such as heat resistance or hygroscopic property of the resist.

Meanwhile, the separate coating of RGB organic EL medias or formation of electrodes in a 3-colors independent luminescent system has been carried out in recent years in production of organic EL display panels. In this field, there is an increasing need for materials capable of forming a reverse tapered resist pattern with an excellent profile and good heat-resistance, low water absorption and high electrical insulation as an insulating member between cathodes. The reasons are those described below. First, the organic EL display panel usually manufactured by following processes. That is, on a plurality of first parallel and striped electrodes provided on a substrate, a plurality of insulating films and barrier plates are arranged at predetermined intervals on and in a direction perpendicular to the first electrodes. Organic EL medias corresponding to luminescent colors such as red (R), green (G), blue (B) etc. are vapor-deposited through a vapor-deposition mask having a predetermined cut-out pattern onto the bare regions of the first electrodes and the barrier plates. Then second electrodes are formed on the organic EL medias by vapor-deposition of a highly electrically conductive metal on the whole surface including the surfaces of the organic EL medias and barrier plates. Thereafter, one side of the substrate on which the barrier plates and organic EL medias have been formed is sealed with glass plate via an adhesive. Inert gas etc. are filled in the hollow space formed by the glass plate, the adhesive and the substrate to shield from moisture in the outside, thus completing the production of the organic EL panel. If the barrier plates have reverse-tapered form at the time of producing the second electrodes, the metal layers vapor-deposited on the barrier plates become discontinuous with the metal layers (i.e. the second electrodes) on the organic EL media, thus preventing electrical connection or short-circuit between the adjacent two electrodes. Further, since the EL luminescent devices are easily damaged by water, solvent components etc., low water absorption materials are desired as that of a barrier plate (JP-A 10-312886). Furthermore, since the barrier plate material is subjected to degassing treatment at high temperatures for removing the residual solvent in the barrier plate material, the material which is not deformed by heating is preferable in order to prevent short-circuit between adjacent electrodes as the material for barrier plate member.

As a radiation sensitive resin composition for lift-off and the method of forming a pattern by lift-off, a negative-working radiation sensitive resin composition containing a compound absorbing exposure light and a method of using the composition (JP Patent No. 2989064) etc. are known.

From the viewpoint of improving heat resistance, there are known that a radiation sensitive resin composition comprising a polymer obtained by ring-opening polymerization of a norbornene derivative and an aromatic bis-azide compound (JP-A 60-111240), a radiation sensitive resin composition comprising a photopolymerization initiator, a sensitizer and a copolymerizable monomer (JP-A 61-23618) etc. In addition, a novolak-based thermosetting resin (JP-A 5-178951), a composition comprising a cyclic olefinic resin and an aromatic bis-azide compound (JP-A 7-92668) have also been proposed. Heat resistance is improved by these prior art techniques, but the compositions described therein need further improvements as the radiation sensitive resin composition used in the method of forming a pattern by the lift-off method, or for a barrier plate materials between cathodes in organic EL panels.

In view of the circumstances described above, the object of the present invention is to provide a method of forming a resist pattern, a method of forming a good metal film pattern by the lift-off method, and an, insulating member in organic EL display panels free of these problems in the prior art. That is, the object of the present invention is to provide a method of forming a reverse tapered resist pattern with an excellent pattern shape, excellent heat resistance, and low water absorption, a method of forming a metal film pattern by using said resist pattern in the lift-off method, and an insulating member in organic EL panels, which comprises said resist pattern.

DISCLOSURE OF THE INVENTION

The present invention relates to a method of forming a reverse tapered resist pattern by use of a negative-working radiation sensitive resin composition, wherein the negative-working radiation sensitive resin composition comprises an alkali-soluble resin obtained by polycondensation of methylol bisphenol compounds, phenol compounds used as necessary and aldehydes, the methylol bisphenol compounds being represented by general formula (I):

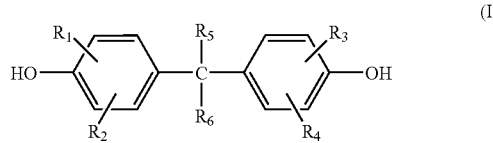

wherein $R_1$ to $R_4$ each represent a hydrogen atom, a $C_1$ to $C_3$ alkyl group or —$CH_2OH$ whereupon at least one of $R_1$ to $R_4$ represents —$CH_2OH$, and $R_5$ and $R_6$ each represent a hydrogen atom or a $C_1$ to $C_3$ alkyl group.

Further, the present invention relates to a method of forming a reverse tapered resist pattern, wherein the alkali-soluble resin in the radiation sensitive resin composition is obtained by using methylol bisphenol compounds represented by general formula (I) above and phenol compounds in a ratio by weight of from 40:60 to 100:0.

Further, the present invention relates to a method of forming a metal film pattern, which comprises forming a metal film over a reverse tapered resist pattern obtained in the pattern-forming method described above and then removing the reverse tapered resist pattern.

Further, the present invention relates to a method of forming a pattern consisting of a metal film, which comprises forming a metal film over a reverse tapered resist pattern obtained in the pattern-forming method described above and using the reverse tapered resist pattern as an insulating member between metal films.

Further, the present invention relates to an organic electroluminescent display comprising a reverse tapered barrier plate member between metal films which is formed from a negative-working radiation sensitive resin composition containing an alkali-soluble resin obtained by polycondensation of methylol bisphenol compounds represented by general formula (I) above, phenol compounds used as necessary and aldehydes.

DETAILED DESCRIPTION OF THE INVENTION

Figure 1:
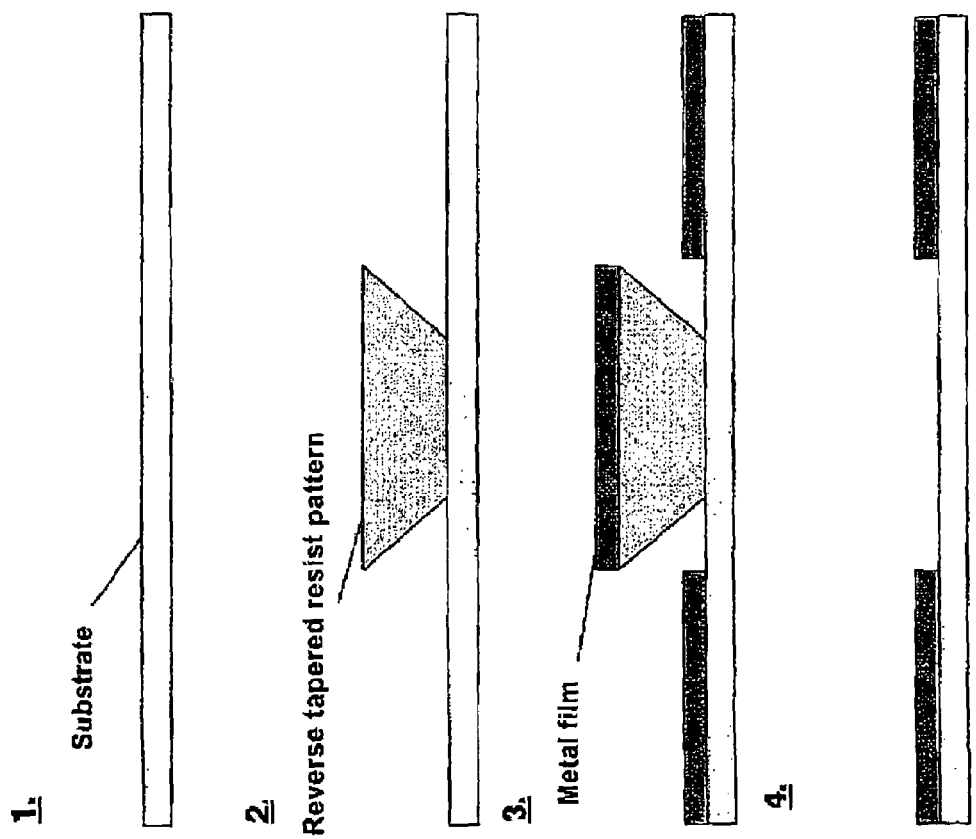
FIG. 1 shows a metal film formed over a reverse tapered resist pattern where the reverse tapered resist pattern is removed.
Figure 2:
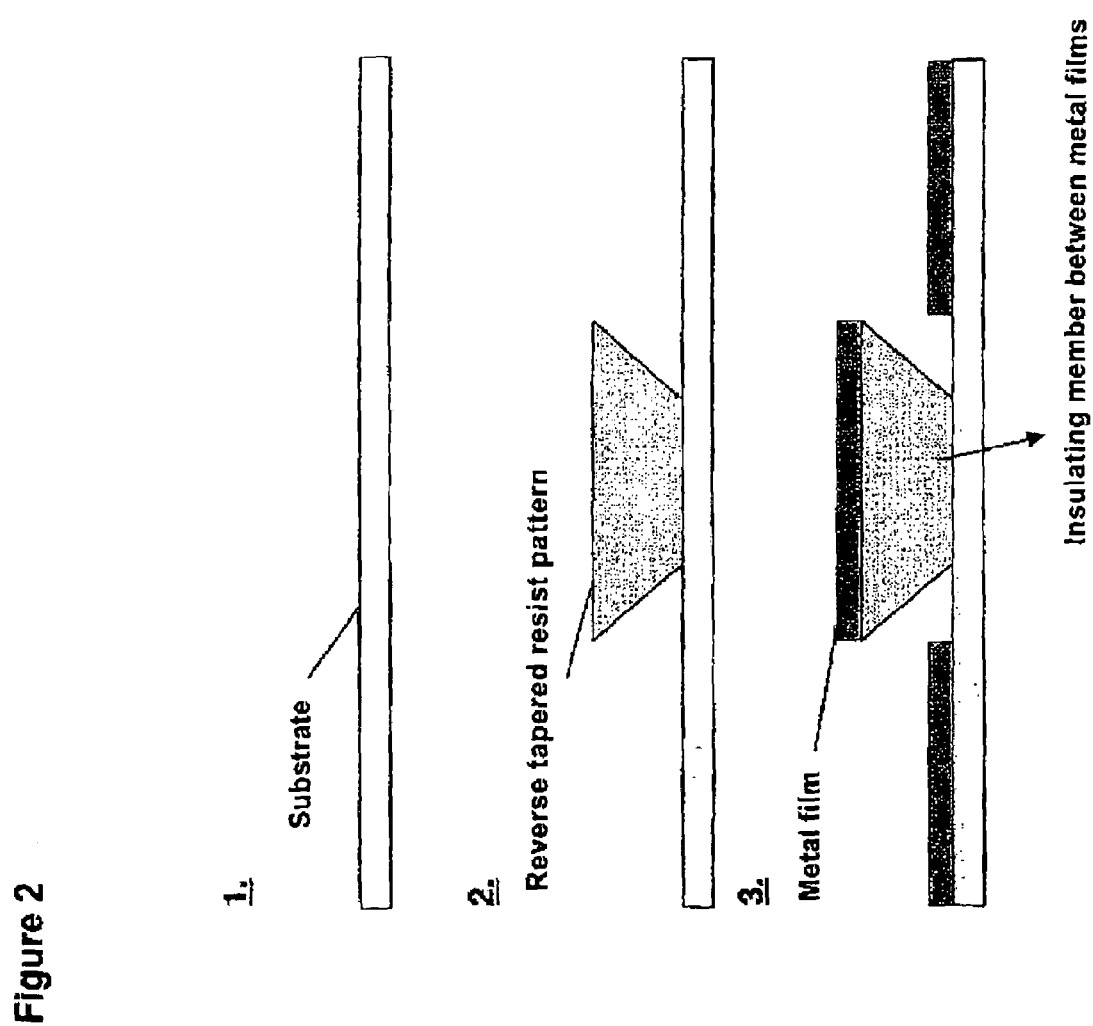
FIG. 2 shows a metal film formed over a reverse tapered resist pattern where the reverse tapered resist pattern is used as an insulating member between metal films.

Hereinafter, the present invention is described in detail.

The above-described negative-working radiation sensitive resin composition, which is used in the method of forming a resist pattern or forming a metal film pattern according to the present invention or used as a material of an insulating member between metal films in the present invention, comprises preferably (A) an alkali-soluble resin obtained by polycondensation of methylol bisphenol compounds represented by general formula (I) above, phenol compounds used as necessary and aldehydes, (B) a crosslinking agent and (C) an photo-acid generator generating an acid upon irradiation. Hereinafter, these materials constituting the negative-working radiation sensitive resin composition are described in more detail.

(A) Alkali-soluble Resin

First, the methylol bisphenol compounds of general formula (I) above serving as a raw material for the alkali-soluble resin used in the present invention can be obtained by reacting bisphenols with formalin in the presence of a basic catalyst and then precipitating the reaction product with an acid. The bisphenols include e.g. bisphenols A, B, C, E, F and G, among which bisphenol A, B or F is particularly preferable. The methylol compound may be any one of mono-, di-, tri-, and tetra-methylol compounds, but as compounds represented by the general formula (I), preferably used are those tetramethylols represented by general formula (II):

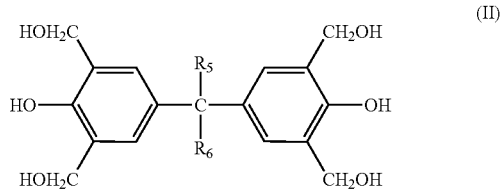

wherein $R_5$ and $R_6$ each represent a hydrogen atom or a $C_1$ to $C_3$ alkyl group.

An alkali-soluble resin used in the present invention is obtainable by adding at least one of aldehydes such as formalin to at least one kind of the methylol bisphenol compounds or a mixture of the methylol bisphenol compound(s) and at least one of phenol compounds used as necessary and allowing the mixture to be polycondensed.

As the phenol compounds to be used for preparing the alkali-soluble resin, which include phenol compounds in a wide sense such as phenols, bisphenols and naphtols, there may be illustrated, for example, phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylene-bisphenol, methylene-bis-p-cresol, resorcinol, catechol, 2-methylresorcinol, 4-methylresorcinol, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, β-naphthol, and the like. These are used singly or as a mixture of two or more thereof.

The proportion (by weight) of the methylol bisphenol compounds and the phenol compounds used is usually from 40:60 to 100:0, preferably from 50:50 to 100:0, and more preferably from 70:30 to 95:5, and the weight average molecular weight of the alkali-soluble resin as determined with polystyrene standards is preferably from 2,000 to 10,000, more preferably 3,000 to 7,000.

The aldehydes used include arbitrary aldehydes such as paraformaldehyde and acetaldehyde as well as formalin, and these can be used singly or as a mixture of two or more thereof. These aldehydes are used in an amount of 0.6 to 3.0 moles, preferably 0.7 to 1.5 moles, relative to 1 mole of the phenol compounds.

(B) Cross-linking Agent

As the cross-linking agent to be used in the present invention, any compound that causes cross-linking reaction by acid can be used. Preferable cross-linking agents include alkoxyalkylated amino resin such as alkoxyalkylated melamine resins, alkoxyalkylated urea resins, etc. as well as melamine type, guanamine type and urea type compounds. As specific examples of such alkoxyalkylated amino resins, there may be illustrated methoxymethylated melamine resin, ethoxymethylated melamine resin, propoxymethylated melamine resin, butoxymethylated melamine resin, methoxymethylated urea resin, ethoxymethylated urea resin, propoxymethylated urea resin, butoxymethylated urea resin, etc.

These cross-linking agents may be used singly or as a mixture of two or more thereof, and are compounded in an amount of usually 2 to 50 parts by weight, preferably 5 to 30 parts by weight, relative to 100 parts by weight of the alkali-soluble resin.

(C) Photo-acid Generator

As the photo-acid generator to be used in the present invention, any one of known or well-known photo-acid generators that have conventionally been used in a chemically amplified radiation sensitive resin composition can be used. Examples thereof include onium salts such as iodonium salts, sulf onium salts, diazonium salts, ammonium salts, pyridinium salts, etc.; halogen-containing compounds such as haloalkyl group-containing hydrocarbon compounds, haloalkyl group-containing heterocyclic compounds, etc.; diazoketone compounds such as 1,3-diketo-2-diazo compounds, diazobenzoquinone compounds, diazonaphthoquinone compounds, etc.; sulfone compounds such as β-ketosulfones, β-sulfonylsulfones, etc.; and sulf onic acid compounds such as alkylsulf onic acid esters, haloalkylsulfonic acid esters, arylsulfonic acid esters, iminosulfonates, etc. These photo-acid generators can be used singly or as a mixture of two or more thereof and compounded in an amount of usually 0.1 to 10 parts by weight, preferably 0.5 to 5.0 parts by weight, relative to 100 parts by weight of the alkali-soluble resin.

The radiation sensitive resin composition of the present invention is compounded preferably with a basic compound as an additive. This basic compound can control the phenomenon of diffusion in the resist film of an acid generated from the photo-acid generator upon exposure, thus improving resolution, exposure allowance etc. Examples of such basic compounds include primary, secondary or tertiary aliphatic amines, aromatic amines, heterocyclic amines, nitrogenous compounds containing alkyl or aryl group, compounds containing amide or imide group, etc.

As solvents used in the radiation sensitive resin composition of the present invention for dissolving the alkali-soluble resin, cross-linking agent and photo-acid generator, there may be illustrated ethylene glycol monoalkyl ethers such as ethylene glycol monomethyl ether, ethylene glycol monoethyl ether, etc.; ethylene glycol monoalkyl ether acetates such as ethylene glycol monomethyl ether acetate, ethylene glycol monoethyl ether acetate, etc.; propylene glycol monoalkyl ethers such as propylene glycol monomethyl ether, propylene glycol monoethyl ether, etc.; propylene glycol monoalkyl ether acetates such as propylene glycol monomethyl ether acetate, propylene glycol monoethyl ether acetate, etc.; lactic esters such as methyl lactate, ethyl lactate, etc.; aromatic hydrocarbons such as toluene, xylene, etc.; ketones such as methyl ethyl ketone, 2-heptanone, cyclohexanone, etc.; amides such as N,N-dimethylacetamide, N-methylpyrrolidone, etc.; lactones such as γ-butyrolactone, etc.; andthelike. Thesesolvents areusedsingly or in combination of two or more thereof.

The radiation sensitive resin composition of the present invention may further contain, if necessary, a dye, an adhesion aid, a surfactant, etc. Examples of the dye include Methyl Violet, Crystal Violet, Malachite Green, etc., examples of the adhesion aid include hexamethyldisilazane, chloromethylsilane, etc., and examples of the surfactant include nonionic surfactants such as polyglycols and the derivatives thereof, i.e., polypropylene glycol or polyoxyethylene lauryl ether, fluorine-containing surfactants such as Fluorad (trade name; made by Sumitomo 3M), Megafac (trade name; made by Dainippon Ink and Chemicals Inc.), Sulfulon (trade name; made by Asahi Glass Co., Ltd.), and organosiloxane surfactants such as KP341 (trade name; made by Shin-etu Kagaku Kogyo K.K.)

In the present invention, the formation of the reverse tapered resist pattern by use of these negative-working radiation sensitive resin compositions is carried out usually in the following manner. That is, the negative-working radiation sensitive resin composition is first applied onto a substrate by a coating method known in the art, such as spin coating, roller coating etc., and then pre-baked to form a photoresist film. The film is subjected to pattern exposure and as necessary to post-exposure bake (PEB), followed by development thereof with an alkali developing solution. By regulating these conditions, the reverse tapered resist pattern can be obtained. The reverse cone angle thereof, that is, the angle of the tapered face of the reverse tapered resist pattern to the substrate, is preferably 75° or less, more preferably 60° or less.

In the present invention, the photoresist film obtained by applying the negative-working radiation sensitive resin composition and then pre-baking it may have an arbitrary thickness. However for use of the reverse tapered resist pattern as e.g. an insulating member between electrodes in an organic EL panel, the thickness of the film is preferably about 1 to 10 μm. As a matter of course, the substrate on which the resist pattern is formed may have electrodes etc. thereon and have an uneven surface. For exposure, there may be used arbitrary radiation which is conventionally used for exposure of radiation sensitive resin compositions, for example ultraviolet rays, deep ultraviolet rays, electron beam, X rays etc.

Further, the formation of the metal film pattern by the lift-off method is carried out by forming a metal film on the substrate by use of as a mask the resist pattern formed described above and then releasing and removing the resist pattern with a solvent etc. The releasing agent for the resist includes e.g. AZ Remover 100 (manufactured by Clariant Japan K.K.). The metal constituting the metal film pattern formed by the present invention may be not only highly electrically conductive metals such as Al, Cu and Au, but also metal oxides etc. For formation of the metal film, vacuum-deposition, sputtering, CVD, ion plating etc. can be used. In this lift-off method, the metal film formed on the resist is removed together with the resist upon removal of the resist pattern, whereby the metal film pattern is formed. By heating the substrate during vapor deposition etc., the temperature of the resist may raise to high temperature. The radiation sensitive resin composition, therefore, is preferably heat-resistant and free from deformation of the pattern upon heating during vapor deposition.

In case of utilizing the reverse tapered resist pattern formed described above as e.g. an insulating member between electrodes in an organic EL panel, an EL medium layer and an electrode layer are vapor-deposited onto the substrate by using the resist pattern as a mask. For that reason, a panel is formed in such a state that the metal layer used for forming electrodes and so on remain on the resist pattern. To prevent short-circuit between adjacent electrodes, it is therefore necessary that the metal film allow to be not formed on the side of the reverse tapered resist pattern upon vapor-deposition of the metal, and that the reverse cone angle is enough to prevent short-circuit, while paying an enough attention for the angle of vapor deposition to an evaporation source. Further, if, for example, the profile of the reverse tapered pattern has a thin projection at a surface part of the resist pattern or the reverse tapered pattern is poor in heat resistance, the resist pattern may be deformed by rise of temperature thereof during vapor-deposition, heating of the resist pattern for minimizing release of organic gas from the barrier plate member, or rise of temperature thereof during dry etching. As a result, the metal layer on the resist pattern and the electrode film may be brought into contact with each other to cause short-circuit between the luminescencent elements. The important requirements for the resist pattern, therefore, are good shape and heat resistance. Further, if the water absorption of the resist is high, water will be generated from the resist constituting the barrier plate member after formation of an organic EL display panel, thus shortening the -longevity of the organic EL panel. It is therefore necessary to select a resist material free of these drawbacks, as described above.

BEST MODE FOR CARRYING OUT THE INVENTION

Hereinafter, the present invention is described in detail by reference to the Examples, which however are not intended to limit the present invention.

Synthesis Example (Synthesis of Alkali-soluble Resin A)

114 g of bisphenol A, 163 g of 37 wt-% formalin and 170 g of water were charged into a separable flask, and then a solution of 40 g of sodium hydroxide in 40 g of water was added dropwise thereto through a dropping funnel. After the solution was added, the mixture was heated to 45° C. and reacted for 8 hours under stirring. After the reaction was completed, the reaction solution was cooled down to 15° C. and then subjected to acid precipitation by adding 500 ml of 2 N hydrochloric acid dropwise thereto through a dropping funnel, whereby powdery crystals of 2,2-bis(3,5-dihydroxymethyl-4-hydroxyphenyl) propane were precipitated. These precipitates were filtered off, washed with water and dried to give 140 g of powdery crystals.

100 parts by weight of a mixture consisting of the tetramethylol derivative of bisphenol A thus obtained and m-cresol (weight ratio, 50:50) was compounded with 54 parts by weight of 37 wt-% aqueous formaldehyde and 2 parts by weight of oxalic acid, and the mixture was reacted at a reaction temperature of 100° C. for 5 hours under a nitrogen atmosphere. The molecular weight of alkali-soluble resin A thus obtained was 6,200 as determined with polystyrene standards.

EXAMPLE 1

100 parts by weight of alkali-soluble resin A obtained in the Synthesis Example, 25 parts by weight of alkoxymethylated benzoguanamine resin and 2 part by weight of 2,4,6-tris(trichloromethyl) triazine were dissolved in propylene glycol monomethyl ether acetate and then filtered through a 0.2 µm Teflon membrane filter to prepare a negative-working radiation sensitive resin composition. This composition was spin-coated onto a 4-inch silicon wafer and then baked on a hot plate at 100° C. for 120 seconds to give a resist film of 3.0 µm in thickness. This resist film was subjected to exposure by a proximity exposure unit (PL501F, Canon Inc.) and then to PEB at 100° C. for 90 seconds, followed by development for 90 seconds with 2.38 wt-% aqueous tetramethylammonium hydroxide solution to form a pattern of 30 µm in width.

The reverse cone angle of the resulting pattern was 50°, and the resist pattern had a good shape having neither thin projection at the edges nor hollows on the top.

The formed pattern was further subjected to heat treatment at a temperature of 300° C. for 60 minutes, and then the shape of the pattern was observed. In the shape, there was little change to dull edges, thickened line width, etc., and the reverse cone angle could be kept at 60°.

COMPARATIVE EXAMPLE 1

A negative-working radiation sensitive resin composition was prepared and a pattern was formed in the same manner as in Example 1 except that the alkali-soluble resin was formed from mixed cresols consisting of m-cresol/p-cresol in a ratio of 6/4. The reverse cone angle of the resulting pattern was 55°, but the edges projected slightly thinly, and there was a hollow of about 1500 Å in depth on the top.

The formed pattern was further subjected to heat treatment at a temperature of 300° C. for 60 minutes, and then the shape of the pattern was observed. The shape was significantly changed to fail to keep the reverse tapered shape.

EXAMPLE 2

A resist film was obtained in the same manner as in Example 1 except that the pattern exposure was conducted by whole image exposure system and the development time was 60 seconds. The resulting resist film was subjected to heat treatment at 270° C. for 60 minutes. Further, the resist film was dried at 50° C. for 24 hours and the weight (M1) of the film was measured. Thereafter, the resist film was immersed in pure water for 24 hours and then the weight (M2) of the film was measured again. The saturated water absorption thereof was 2.72% as determined from the equation:

Saturated water absorption=$((M2-M1)/(M1-W))\times 100$ wherein W is the weight of the wafer.

COMPARATIVE EXAMPLE 2

The water absorption was determined in the same manner as in Example 2 except that the radiation sensitive resin composition used was the radiation sensitive resin composition in Comparative Example 1. The water absorption thus determined was 4.63%, indicating that the water absorption of the resulting resist pattern was 1.7 times as high as that of the radiation sensitive resin composition of the present invention.

As can be seen from the results described above, the radiation sensitive resin composition used in the present invention can form a reverse tapered resist pattern with good shape, which is superior in heat resistance and shows low water absorption. Therefore the composition can be preferably used not only as a radiation sensitive resin composition for the lift-off method but also as barrier plate material between electrodes in organic EL displays.

EFFECT OF THE INVENTION

As described above in detail, a reverse tapered resist pattern with a good shape can be formed by the pattern-forming method of using the novel negative-working radiation sensitive resin composition of the present invention. By virtue of superior heat resistance, the formed reverse tapered resist pattern permits formation of a good metal film pattern by the lift-off method, and by virtue of low water absorption, it can be used preferably as a barrier plate material between electrodes in organic EL displays.

What is claimed is:

1. A method of forming a reverse tapered resist pattern by use of a negative-working radiation sensitive resin composition, wherein the negative-working radiation sensitive resin composition comprises an alkali-soluble resin obtained by polycondensation of methylol bisphenol compounds represented by the general formula (I) below, phenol compounds used at the ratio of from 40:60 to 100:0 by weight, respectively and aldehydes;

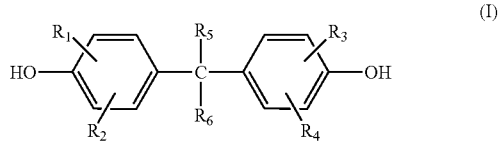

(I)

wherein $R_1$ to $R_4$ each represent a hydrogen atom, a $C_1$ to $C_3$ alkyl group or —$CH_2OH$ whereupon at least one of $R_1$ to $R_4$ represents —$CH_2OH$, and $R_5$ and $R_6$ each represent a hydrogen atom or a $C_1$ to $C_3$ alkyl group.

2. The method of forming a reverse tapered resist pattern according to claim 1, wherein said alkali-soluble resin is obtained by using the methylol bisphenol compounds represented by the general formula (I) above and the phenol compounds at the ratio of from 50:50 to 100:0 by weight.

3. A method of forming a metal film pattern, wherein a metal film is formed over a reverse tapered resist pattern obtained by the method of forming a reverse tapered resist pattern according to claim 1 and then the reverse tapered resist pattern is removed.

4. A method of forming a pattern made of a metal film, wherein a metal film is formed over a reverse tapered resist pattern obtained by the method of forming a reverse tapered resist pattern according to claim 1 and then said reverse tapered resist pattern is used as an insulating member between metal films.

* * * * *